(12) United States Patent
Illegems et al.

(10) Patent No.: US 8,203,392 B2
(45) Date of Patent: Jun. 19, 2012

(54) OSCILLATOR STABILIZED FOR TEMPERATURE AND POWER SUPPLY VARIATIONS

(75) Inventors: Paul F. Illegems, Tucson, AZ (US); Srinivas K. Pulijala, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 68 days.

(21) Appl. No.: 11/844,487

(22) Filed: Aug. 24, 2007

(65) Prior Publication Data
US 2009/0051443 A1   Feb. 26, 2009

(51) Int. Cl.
*H03L 1/00*   (2006.01)

(52) U.S. Cl. ............ 331/176; 331/57; 331/66; 331/111; 331/143; 331/175; 327/540; 327/541

(58) Field of Classification Search .................. 327/541, 327/540; 331/57, 111, 143, 175, 176, 66
See application file for complete search history.

(56) References Cited

U.S. PATENT DOCUMENTS

| | | | |
|---|---|---|---|
| 5,278,523 A | 1/1994 | Kriz | |
| 5,341,112 A | 8/1994 | Haman | |
| 5,386,201 A | 1/1995 | Bennett et al. | |
| 5,440,277 A * | 8/1995 | Ewen et al. | 331/176 |
| 5,764,110 A | 6/1998 | Ishibashi | |
| 5,936,478 A | 8/1999 | Lee et al. | |
| 5,945,883 A | 8/1999 | Nagasawa et al. | |
| 6,066,991 A | 5/2000 | Naito et al. | |
| 6,271,652 B1 * | 8/2001 | Burstein et al. | 323/313 |
| 6,377,130 B1 | 4/2002 | Haman | |
| 6,462,625 B2 * | 10/2002 | Kim | 331/57 |
| 6,522,208 B1 | 2/2003 | Knowles | |
| 6,771,117 B2 * | 8/2004 | Nakai | 327/541 |
| 6,775,217 B1 | 8/2004 | Kato et al. | |
| 6,809,603 B1 | 10/2004 | Ho | |
| 6,853,258 B2 | 2/2005 | Toliver et al. | |
| 6,930,534 B1 | 8/2005 | Fu | |
| 6,985,040 B2 * | 1/2006 | Kim | 331/16 |
| 6,992,533 B2 | 1/2006 | Hollinger et al. | |
| 7,129,798 B2 | 10/2006 | Aoyama et al. | |
| 7,132,880 B2 * | 11/2006 | Ingino, Jr. | 327/541 |
| 7,164,325 B2 | 1/2007 | Aparin et al. | |
| 7,342,465 B2 | 3/2008 | Seefeldt | |
| 2004/0251980 A1 | 12/2004 | Hollinger et al. | |
| 2005/0280477 A1 * | 12/2005 | Reddy et al. | 331/57 |
| 2006/0232326 A1 * | 10/2006 | Seitz et al. | 327/539 |
| 2007/0036017 A1 * | 2/2007 | Seo | 365/222 |
| 2007/0273453 A1 * | 11/2007 | Maher | 331/176 |
| 2008/0084249 A1 * | 4/2008 | Noguchi | 331/66 |

* cited by examiner

*Primary Examiner* — Arnold Kinkead
*Assistant Examiner* — Richard Tan
(74) *Attorney, Agent, or Firm* — Meyertons Hood Kivlin Kowert & Goetzel, P.C.; Jeffrey C. Hood

(57) ABSTRACT

A circuit may comprise an amplifier powered by a first supply voltage, with a first input of the amplifier coupled to a stable reference voltage, and the output voltage of the amplifier provided as a designated supply voltage to an oscillator configured to produce a periodic signal having a specified frequency. The circuit may further include a control circuit coupled to a second input of the amplifier, to the output of the amplifier, and to ground, and configured to control the rate of change of the output voltage of the amplifier with respect to temperature. This rate of change may be specified according to a characterization of the oscillator over supply voltage and temperature, and may result in stabilizing the specified frequency across temperature. The periodic signal may therefore be unaffected by variations in the first supply voltage, and the amplitude of the periodic signal may be proportional to the stable reference voltage.

27 Claims, 1 Drawing Sheet

OSCILLATOR STABILIZED FOR TEMPERATURE AND POWER SUPPLY VARIATIONS

BACKGROUND OF THE INVENTION

1. Field of the Invention

This invention relates generally to the field of analog integrated circuit design and, more particularly, to the design of oscillators stabilized for temperature and power supply variations.

2. Description of the Related Art

Oscillators play a prominent role in the functionality of a large portion of today's analog and digital systems. Typically, oscillators, also referred to as astable multivibrators, are electronic circuits that convert energy from direct-current sources into periodically varying electrical signals, or voltages. In other words, an oscillator typically operates by utilizing the electrical behavior of its circuit elements to convert a steady state input signal into a periodic, time variant output signal. In some implementations the signal produced by an oscillator may be sinusoidal in appearance, such as a sine wave, in other implementations it may appear as a square wave, triangular wave, or a variety of other repeatable signals. Many of today's integrated circuits that require oscillators, such as timer circuits and Phase-Locked Loops (PLLs), need to include the oscillators on-chip in order to meet cost and area requirements. The behavior of such on-chip oscillators is typically directly or indirectly affected by the technology used to fabricate the integrated circuit. For example, many widely used fabrication processes today are based on complementary metal-oxide-semiconductor (CMOS) technology, where each specific qualified CMOS process varies slightly from another. In addition, the accuracy of oscillators may also be affected by variations in temperature as well as variations in the power supply voltage(s) powering the oscillator.

One common type of oscillator is the relaxation oscillator. Typically a relaxation oscillator achieves its oscillating output by charging a capacitor to some event or switching threshold. The event discharges the capacitor, and its recharge time determines the repetition time of the events or switching. Similarly, an oscillating output could also be achieved by discharging instead of charging the capacitor to reach the event or switching threshold. Typically the capacitor is charged through a resistor, where the values of the resistor and the capacitor, referred to as the RC time constant, determine the rate, or frequency, of the oscillation. For example, decreasing the value of the resistor may increase the oscillation frequency, and increasing the value of the resistor may decrease the oscillation frequency. Typical relaxation oscillators whose frequency is determined by an RC time constant may be prone to temperature and voltage supply variations, since the resistor(s) and capacitor(s) (corresponding to the RC time constant) are temperature dependent, as well as supply dependent with the amplitude of the signals typically affecting the oscillator frequency.

Another widely used type of oscillator is the ring oscillator. A ring oscillator is typically a device comprising an odd number of logic gates with an inverting output, whose output oscillates between two voltage levels, representing logic levels of "1" and "0". The gates are usually inverters coupled in a chain, with the output of the last inverter in the chain coupled back to the input of the first inverter. Because a single inverter provides an inverted version of its input, the output of a last inverter in a chain composed of an odd number of inverters will be the logically inverted version of the first input. This final output will be asserted a finite amount of time after the first input has been asserted, and providing the inverted (final) output as the feedback to the input will therefore lead to oscillation. A ring oscillator typically only requires a power supply to operate, and once a certain threshold voltage has been reached, oscillations may begin automatically. To increase the frequency of a given oscillator, the applied voltage may be increased, thereby increasing both the frequency of the oscillation and the consumed power, which is generally dissipated as heat. However, any dissipated heat may limit the speed of a given oscillator. Similar to relaxation oscillators, ring oscillators are also prone to temperature and power supply voltage variations, which may affect the accuracy of the oscillator's output frequency.

While various solutions have been implemented to guard oscillators against variations in temperature and supply voltage levels, for example including providing temperature compensation for the logic used in a ring oscillator, supply voltage variations still make it difficult to avoid variations in the oscillator output frequency. Other corresponding issues related to the prior art will become apparent to one skilled in the art after comparing such prior art with the present invention as described herein.

SUMMARY OF THE INVENTION

In one set of embodiments, the invention comprises a system and method that allows an oscillator to operate with increased immunity to variation in the frequency of oscillation that may be caused by a variation in temperature and/or variation in the power supply voltage. A circuit configured to power the oscillator, that is, provide a designated supply voltage to the oscillator, may be designed to take advantage of the fact that the oscillator frequency may increase with an increase in the supply voltage, and decrease with an increase in temperature. Thus, a PTAT (proportional to absolute temperature) voltage may be created to provide the supply voltage to the oscillator. When properly tuned, the increase in oscillator supply voltage may offset the reduction of the oscillator frequency resulting from rising temperatures. When the amplitude of the periodic signal generated by the oscillator is a function of the PTAT voltage, this signal may be translated to the logic supply voltage.

In one set of embodiments, a PTAT voltage may be generated with a slope determined by two resistors R1 and R2 coupled in series with a substrate PNP transistor. The PTAT voltage may be generated using a differential amplifier, e.g. an operational amplifier (op-amp), which may be powered by a first supply voltage. A stable reference voltage may be provided to one of the differential inputs of the amplifier, while the series of two resistors and substrate transistor may be coupled between the output of the amplifier and a low reference, e.g. ground. The other input of the amplifier may be provided as a feedback signal from the common node between R1 and R2, with the PTAT voltage generated at the output of the amplifier. This PTAT voltage may then be provided as the supply voltage to an oscillator, e.g. a ring oscillator, which may be configured to generate a periodic clock signal. The periodic clock signal may be used as a clock input to a [digital] system. In embodiments where the amplitude of the oscillator output signal is not already at a desired level, a level translator circuit may be used to translate the level of the oscillator output to the desired level corresponding to a supply voltage used in the [digital] system.

The level of the stable reference voltage may be used to adjust the amplitude of the designated supply voltage [to be provided to the oscillator], and the respective values of R1, and R2 may be used to adjust the rate of change of the designated supply voltage with respect to temperature, (in other words, the PTAT slope of designated supply voltage). By appropriately setting the values of the stable reference voltage, R1, and R2, a flat frequency response over a large temperature range may be achieved. The periodic voltage signal output by the oscillator may therefore be kept independent of the first supply voltage, as the amplitude of the periodic voltage signal will be proportional to the amplitude of the stable reference voltage, which itself may be independent of the first supply voltage. The amplitude and slope of the PTAT voltage may be specified according to a characterization of the oscillator output over supply voltage and temperature variations. Once the oscillator output has been characterized, the values of R1, R2, and the stable reference voltage may be correspondingly chosen to obtain the desired PTAT voltage to be used as the supply voltage for the oscillator.

As previously mentioned, the periodic signal generated by the oscillator may be used as a clock signal for a [digital] system. The system may be configured to operate with a supply voltage that is different than the stable reference voltage used in generating the periodic signal. Because the amplitude of the periodic signal generated by the oscillator may be based on the designated supply voltage, which itself may be proportional to the stable reference voltage, the amplitude of the periodic signal may therefore not match or be consistent with the supply voltage used by the system. In some embodiments, a voltage difference between the amplitude of the periodic signal and the supply voltage used by the system could result in crowbar current flowing through the digital circuitry. The amplitude of the periodic signal may be translated to match the supply voltage used by the system, while retaining the frequency of the periodic signal. This new periodic signal may then be used as the clock to the digital circuitry.

Advantages of providing the designated supply voltage to the oscillator as described above include stable oscillation frequency over a large temperature and supply voltage range, less quiescent current in the oscillator when compared to using a common supply voltage for the oscillator and the digital circuitry, and stability across process variations resulting from the PTAT voltage's dependence on a stable reference voltage, the ratio of resistors, and diode characteristics, all of which are stable.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
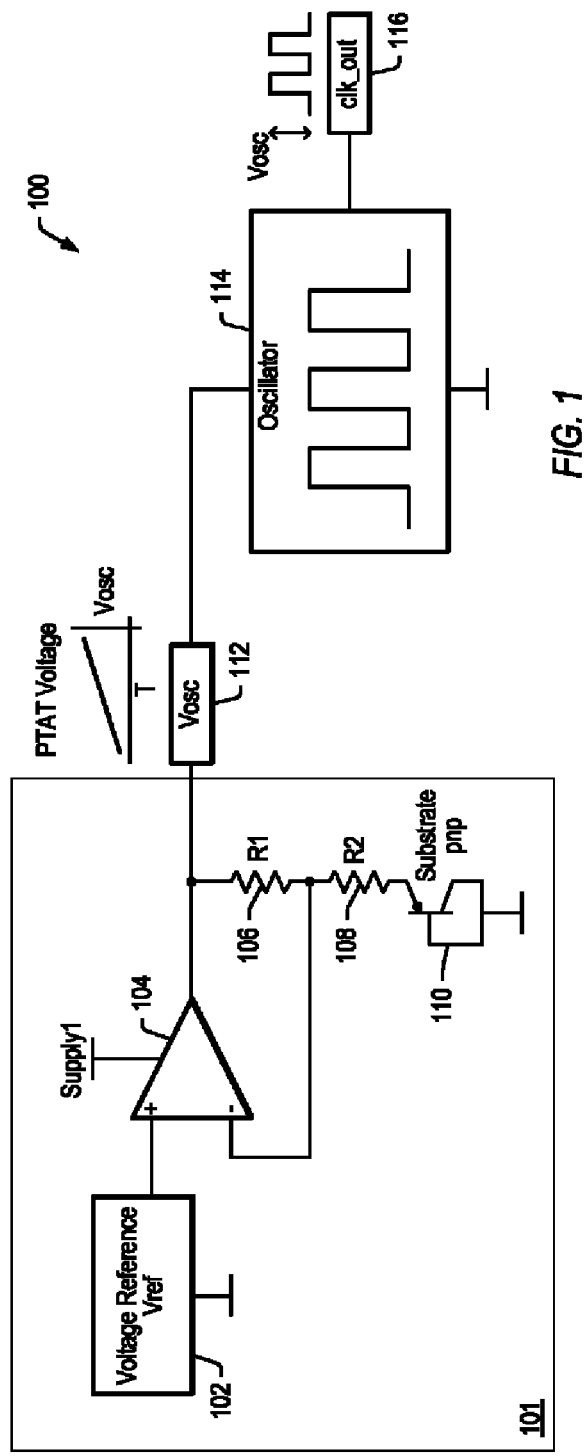
FIG. 1 shows one embodiment of a system comprising an oscillator and a circuit configured to provide a supply voltage to the oscillator.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims.

Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As used herein, "structure type" refers to the physical structure of an individual resistive element, or resistor implemented on an integrated circuit for a given process. For example, for a given CMOS process a resistor may be implemented to be of one of a variety of structure types, which may include n-diffusion, p-diffusion, n-well, p-well, pinched n-well, pinched p-well, poly-silicon and metal. When configured on an integrated circuit, a single "resistance" may be constructed as a single resistor or as two or more resistors connected together, where each individual resistor may be of a different structure type. When constructed of more than one resistor, the nominal value of the resistance may be equivalent to the sum of the nominal values of the resistors that make up the resistance. A "resistor string" refers to resistances connected in series, with connective taps available at the terminals of the resistances. Similarly, a "capacitance" may be constructed as a single capacitor or as two or more capacitors connected together. When constructed of more than one capacitor, the nominal value of the capacitance may be equal to the sum of the nominal values of the capacitors that make up the capacitance.

The term "integrated oscillator" refers to an oscillator whose components are configured on one integrated circuit. Furthermore, an integrated oscillator may itself be configured on one integrated circuit together with a system that uses the oscillator. The word "alternately" is meant to imply passing back and forth from one state, action, or place to another state, action, or place, respectively. For example, "alternately charging and discharging a node" would mean charging the node, then discharging the node, then charging the node, then discharging the node, and so on.

FIG. 1 shows one embodiment of a system 100 comprising an oscillator 114 and a circuit 101 configured to provide a supply voltage 112 to oscillator 114. In one set of embodiments, circuit 101 may be configured to generate voltage 112 as a PTAT (proportional to absolute temperature) voltage having a specified slope [with respect to temperature]. Supply voltage 112 may be developed at the output of amplifier 104, which may be coupled to a supply terminal of oscillator 114 to provide supply power to oscillator 114. In one set of embodiments, circuit 101 may include a control circuit coupled to the amplifier and to a signal reference voltage (e.g. reference ground), to generate voltage 112 with a desired rate of change over temperature in order to stabilize the specified frequency of periodic signal (clk out 116). In one embodiment, the control circuit comprises resistances R1 106 and R2 108, and a PN-junction device 110, coupled as shown in FIG. 1. The slope of supply voltage 112 with respect to temperature may be determined by resistances R1 106, R2 108, and a PN-junction, shown here as substrate PNP transistor 110. It should be noted that while the embodiment shown in FIG. 1 features a substrate PNP transistor, alternate embodiments might be configured using a different device, or devices, which comprise a PN-junction having the desired temperature behavior. Such devices include, but are not limited to diodes, and bipolar junction transistors (BJT) with the collector tied to the base. In general, those skilled in the art will recognize that various other implementations are possible with alternate devices that exhibit the desired temperature behavior. A reference voltage 102 may provide a stable voltage input to an input terminal (in this case to the non-inverting input terminal) of amplifier 104. Resistance R1 106, R2 108, and transistor 110 may be coupled in series as shown, with the common node between resistances R1 106 and R2 108 coupled to the other input (in this case the inverting input) of amplifier 104 in a feedback loop, to allow control of the PTAT slope of supply voltage 112. Overall, reference voltage 102, resistance R1, and resistance R2 allow the level and PTAT slope of supply voltage 112 to be adjusted.

Equation (1) shows the basic relationship between supply voltage 112 and reference voltage 102, resistance R1, and resistance R2.

$$Vosc = Vref\left(1 + \frac{R1}{R2}\right) - \frac{R1}{R2} Vbe, \qquad (1)$$

Vosc is supply voltage 112, Vref is reference voltage 102, and Vbe is the voltage across the base-emitter junction of transistor 110, and may be expressed as $$Vbe = \left(\frac{kT}{q}\right)\ln\left(\frac{Ic}{Is}\right), \qquad (2)$$

where T is temperature, Ic is the collector current of transistor 110, and Is is the saturation current of transistor 110. The change of Vbe with respect to temperature may then be expressed as $$\frac{\partial Vbe}{\partial T} \approx -2 \text{ mV/K} \Rightarrow \frac{\partial Vosc}{\partial T} \approx \frac{2 \cdot R1}{R2} \text{ mV/K}. \qquad (3)$$

It follows, therefore, from equations (1) and (3), that a flat frequency response for oscillator output 116 may be obtained over a large temperature range, when properly setting reference voltage 102, and resistors R1 and R2. For example, when supply voltage Supply 1 is set to 5 V and reference voltage 102 is set to 1.2 V, values of 76 kΩ and 27 kΩ for resistors R1 and R2, respectively, may result in a value of 2.82 V (at room temperature) for supply voltage 112, and a flat frequency response of oscillator output signal 116. As previously suggested, reference voltage 102 may be independent of supply voltage Supply 1, resulting in supply voltage 112 being independent of supply voltage Supply 1 and being proportional to reference voltage 102 instead. The amplitude and slope of [PTAT] supply voltage 112 may be determined and specified based on a characterization of oscillator 114, that is, a characterization of periodic signal 116 over supply voltage and temperature. In other words, the frequency of periodic signal 116 may be plotted as a function of temperature while oscillator 114 is provided a fixed supply voltage, and similarly, the frequency of periodic signal 116 may be plotted as a function of the supply voltage(s) provided to oscillator 114 while the temperature remains fixed, and/or substantially fixed. These function curves would yield the PTAT slope that may be specified to obtain a stabilized frequency of periodic signal 116 across temperature.

Figure 2:
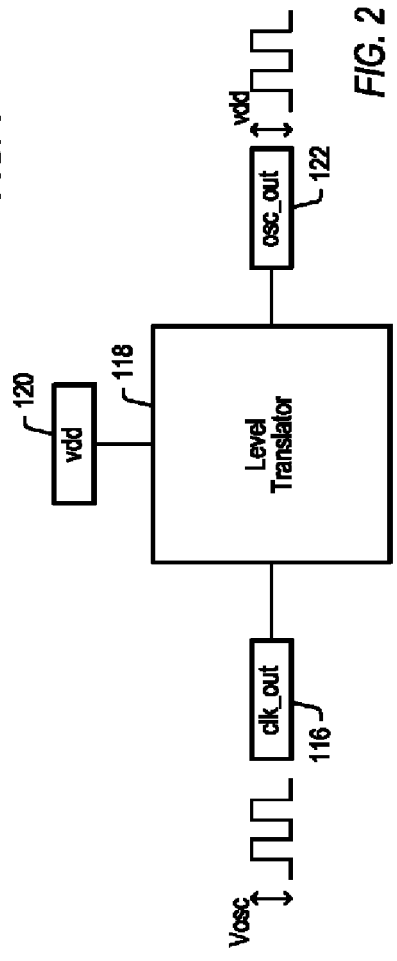
FIG. 2 shows one way of changing the amplitude of the periodic signal generated by the oscillator to match the level of a system supply voltage.

As indicated above (and in FIG. 1), a stable reference voltage 102 may be used as an input to amplifier 104. Supply voltage 112 may then be used as a supply voltage input to oscillator 114. Thus, the amplitude of periodic signal 116 generated by oscillator 114 may be a function of supply voltage 112, (and hence a function of stable reference voltage 102). When periodic signal 116 is used as a clock (e.g. system clock) for a digital system/circuitry, and the supply voltage provided to the digital system/circuitry is an external supply (Vdd) 120 that is higher than supply voltage 112, then a crowbar current may be developed between the respective rails of supply voltage 112 and external supply Vdd 120. In order to eliminate the potential for this crowbar current, the amplitude of periodic signal 116 may be translated to match the external supply voltage Vdd 120. FIG. 2 shows how a first periodic signal, such as the output of oscillator 114, i.e. periodic signal 116, may be provided to the input of level translator circuit 118 to produce a second periodic signal, such as final oscillator output signal 122 having an amplitude equivalent to Vdd 120. Output signal 122 may then be used as the clock input to the digital system/circuitry, having retained the frequency of periodic output signal 116, as well as the flat frequency response over a given temperature range, and the independence from supply voltage Supply 1. In one set of embodiments, supply voltage Supply 1 may be 5 V, the logic supply voltage Vdd 120 may be 3.3 V, and the temperature range used may be 0-125C.

In one set of embodiments, oscillator 114 may a ring oscillator, and may be constructed using MOS (metal-oxide semiconductor) manufacturing techniques. Thus, ring oscillator 114 may comprise MOS capacitors, inverters, and resistors. It should be noted, that circuit 101 from FIG. 1 may be configured as a buffer for oscillator 114, and may be part of the same integrated circuit as oscillator 114. In some embodiments, voltage reference 102 may not be a part of the buffer, and only amplifier 104, and resistors R1 and R2 (and transistor 110, or other appropriate device exhibiting the desired temperature behavior, e.g. a semiconductor device comprising a PN-junction) may be a part of the buffer. Oscillator 114 may not necessarily be a ring oscillator and may be an oscillator of another type. Those skilled in the art will recognize that various combinations and configurations are possible, and various embodiments different from the one shown in FIG. 1 may be implemented according to the basic principle illustrated in the embodiment provided in FIG. 1. The various components shown in FIG. 1 may all be comprised in a single integrated circuit or in two or more integrated circuits, as desired.

Advantages of providing oscillator 114 with a supply voltage 112 as discussed above include, among others, stable oscillation frequency over large temperature and oscillator supply voltage ranges, and less quiescent current flowing in the oscillator when compared to an arrangement in which a single supply voltage is used for powering the oscillator and the rest of the system. In addition, supply voltage 112, which may be configured as a PTAT voltage, being dependent on reference voltage 102, the ratio of resistors R1 and R2, and the diode characteristics of substrate transistor 110, all of which are stable across process variations, results in a stable oscillator output that is immune to supply voltage variations.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A supply circuit for providing a designated supply voltage at a supply terminal of an oscillator for powering the oscillator, the oscillator configured to produce a periodic signal having a specified frequency, the supply circuit comprising:
   an amplifier powered by a first supply voltage, wherein a first input terminal of the amplifier is configured to receive a stable reference voltage, and wherein an output of the amplifier is configured to couple to the supply terminal of the oscillator, wherein the designated supply voltage is a voltage developed at the output of the amplifier; and
   a control circuit coupled to a second input terminal of the amplifier, to the output of the amplifier, and to a voltage reference, wherein when the supply circuit is providing the designated supply voltage at the supply terminal, the control circuit is configured to vary the value of the designated supply voltage at a specific rate with respect to change in temperature as the temperature changes to stabilize the specified frequency of the periodic signal across variations in temperature;
   wherein the amplitude of the periodic signal is a function of the stable reference voltage.

2. The supply circuit of claim 1, wherein the control circuit comprises:
   a first resistive element and a second resistive element, each having a first terminal and a second terminal, wherein the first terminal of the first resistive element and the first terminal of the second resistive element are coupled to the second input terminal of the amplifier, wherein the second terminal of the first resistive element is coupled to the output of the amplifier, wherein the second terminal of the second resistive element is coupled to a first terminal of a PN-junction, and wherein a second terminal of the PN-junction is coupled to the voltage reference;
   wherein the specific rate is set by the PN-junction, and respective values of the first resistive element and the second resistive element.

3. The supply circuit of claim 2, wherein the PN junction is comprised in one of:
   an NPN bipolar junction transistor;
   a PNP bipolar junction transistor;
   an NPN substrate transistor;
   a PNP substrate transistor; or
   a diode.

4. The supply circuit of claim 2, wherein the voltage reference is ground.

5. The supply circuit of claim 1, wherein the variation of the value of the designated supply voltage at the specific rate with respect to change in temperature is proportional to absolute temperature.

6. The supply circuit of claim 1, wherein the specific rate is determined and specified according to a characterization of the oscillator with respect to:
   variations in a test supply voltage applied to the supply terminal; and
   variations in temperature.

7. The supply circuit of claim 6, wherein the characterization of the oscillator comprises:
   the specified frequency established as a function of temperature for a fixed value of the test supply voltage; and
   the specified frequency established as a function of the test supply voltage for a substantially constant temperature.

8. The supply circuit of claim 1, wherein the amplifier is a differential amplifier, wherein the first input terminal of the amplifier is a non-inverting input terminal and the second input terminal of the amplifier is an inverting input terminal.

9. A method comprising:
   generating a designated supply voltage at an output of an amplifier by powering the amplifier with a first supply voltage;
   inputting a stable reference voltage that is independent of the first supply voltage into a first input terminal of the amplifier;
   varying the value of the designated supply voltage at a specific rate with respect to change in temperature as temperature varies, using a control circuit coupled to a second input terminal of the amplifier, to the output of the amplifier, and to a voltage reference;
   powering an oscillator with the designated supply voltage; and
   in response to said powering, the oscillator generating a first periodic signal having a specified frequency;
   wherein in response to varying the value of the designated supply voltage at the specific rate as the temperature varies, the frequency of the first periodic signal remains unaffected by variations in temperature; and
   wherein in response to generating the designated supply voltage based on the stable reference voltage that is independent of the first supply voltage, the amplitude of the first periodic signal becomes a function of the stable reference voltage and remains unaffected by variations in the value of the first supply voltage.

10. The method of claim 9, wherein said varying the value of the designated supply voltage comprises inputting a second voltage into the second input terminal of the amplifier, the second voltage having a value that varies at a specific rate with respect to change in temperature.

11. The method of claim 9, further comprising:
    generating a second periodic signal based on the first periodic signal and a second supply voltage, wherein the second periodic signal has the specified frequency and an amplitude determined by the second supply voltage.

12. The method of claim 9, wherein said generating the designated supply voltage comprises:
    determining the specific rate based on a characterization of the oscillator.

13. A system comprising:
    an oscillator comprising an oscillator supply terminal, and configured to provide a first periodic signal having a specified frequency;
    an amplifier comprising:
       an amplifier supply terminal configured to receive a first supply voltage to power to the amplifier;
       a first input terminal configured to receive a stable reference voltage; and
       an output, wherein the amplifier is configured to develop an output voltage at its output, and provide the output voltage developed at the output of the amplifier to the oscillator supply terminal to power the oscillator; and
    a control circuit coupled to a second input terminal of the amplifier, to the output of the amplifier, and to signal ground, wherein the control circuit is configured to control a rate of change at which the value of the output voltage changes with respect to varying temperature, causing the frequency of the first periodic signal to remain unaffected by variations in temperature;
    wherein the amplitude of the periodic signal is a function of the stable reference voltage and remains unaffected by variations in the value of the first supply voltage.

14. The system of claim 13, wherein the oscillator is a ring oscillator.

15. The system of claim 13, wherein the amplifier is an operational amplifier, wherein the first input terminal of the amplifier is a non-inverting input terminal and the second input terminal of the amplifier is an inverting input terminal.

16. The system of claim 13, further comprising:
a level translator circuit configured to be powered by a second supply voltage and further configured to generate a second periodic signal based on the first periodic signal, wherein the second periodic signal has the specified frequency, and an amplitude equivalent to the second supply voltage.

17. The system of claim 13, wherein the rate of change is specified according to a characterization of the oscillator, wherein the characterization of the oscillator comprises:
the specified frequency established as a function of temperature for a fixed supply voltage applied to the supply terminal; and
the specified frequency established as a function of a test supply voltage applied to the supply terminal for a substantially constant temperature.

18. The system of claim 13, wherein the control circuit comprises:
a first resistor and a second resistor, each having a first terminal and a second terminal, wherein the first terminal of the first resistor and the first terminal of the second resistor are coupled to the second input terminal of the amplifier, wherein the second terminal of the first resistor is coupled to the output of the amplifier, wherein the second terminal of the second resistor is coupled to a first terminal of a PN-junction, and wherein a second terminal of the PN junction is coupled to the signal ground;
wherein the rate of change is set by the PN-junction, and by respective values of the first resistor and the second resistor.

19. A method comprising:
generating a supply voltage at an output of an amplifier by powering the amplifier with a first supply rail;
inputting a stable reference voltage into a first input terminal of the amplifier, wherein the stable reference voltage is independent of the first supply rail;
controlling the supply voltage to have a specific nonzero PTAT (proportional to absolute temperature) characteristic that defines a specific rate at which a value of the supply voltage changes with respect to variations in temperature, using a control circuit coupled to a second input terminal of the amplifier, to the output of the amplifier, and to a voltage reference;
powering an oscillator with the supply voltage; and
in response to said powering, the oscillator generating a first periodic signal having a specified frequency;
in response to the supply voltage having the specific nonzero PTAT characteristic, the specified frequency of the first periodic signal remaining unaffected by variations in temperature and changes in the value of the supply voltage.

20. The method of claim 19, wherein an amplitude of the first periodic signal is a function of the stable reference voltage.

21. The method of claim 19, further comprising:
determining and specifying a slope of the specific nonzero PTAT characteristic based on a characterization of the oscillator with respect to:
varying the supply voltage powering the oscillator while temperature remains constant; and
varying temperature while the supply voltage powering the oscillator remains constant.

22. The method of claim 19, wherein said inputting the stable reference voltage into the amplifier comprises inputting the stable reference voltage into the first input terminal of the amplifier;
wherein said controlling the supply voltage comprises inputting a second voltage into the second input terminal of the amplifier, wherein a value of the second voltage varies at the specific rate with respect to variations in temperature.

23. The method of claim 22, further comprising generating the second voltage based on the supply voltage.

24. A method comprising:
powering an amplifier with a first supply voltage;
providing a stable reference voltage that is independent of the first supply voltage at a first input of the amplifier;
in response to said powering and said providing, the amplifier developing a designated supply voltage at its output;
varying the value of the designated supply voltage at a specific rate with respect to change in temperature as temperature varies, using a control circuit coupled to a second input of the amplifier, to the output of the amplifier, and to a voltage reference;
powering an oscillator with the designated supply voltage;
in response to said powering, the oscillator generating a first periodic signal having a specified frequency;
in response to said varying, the frequency of the first periodic signal remaining unaffected by variations in temperature; and
in response to said providing, the amplitude of the first periodic signal becoming a function of the stable reference voltage and remaining unaffected by variations in the value of the first supply voltage.

25. The method of claim 24, further comprising generating the stable reference voltage.

26. The method of claim 24, further comprising:
generating a second periodic signal based on the first periodic signal and a second supply voltage, wherein the second periodic signal has the specified frequency and an amplitude determined by the second supply voltage.

27. The method of claim 24, further comprising determining the specific rate based on a characterization of the oscillator.

* * * * *